United States Patent
Terzioglu

(10) Patent No.: US 8,611,144 B2
(45) Date of Patent: *Dec. 17, 2013

(54) NON-VOLATILE MEMORY WITH SPLIT WRITE AND READ BITLINES

(71) Applicant: QUALCOMM Incorporated, San Diego, CA (US)

(72) Inventor: Esin Terzioglu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/667,187

(22) Filed: Nov. 2, 2012

(65) Prior Publication Data
US 2013/0058151 A1    Mar. 7, 2013

Related U.S. Application Data

(63) Continuation of application No. 12/849,862, filed on Aug. 4, 2010, now Pat. No. 8,331,126.

(51) Int. Cl.
*G11C 11/00* (2006.01)

(52) U.S. Cl.
USPC ........................................ 365/158; 365/225.7

(58) Field of Classification Search
USPC .................. 365/96, 158, 171, 173, 225.7, 148
See application file for complete search history.

(56) References Cited

U.S. PATENT DOCUMENTS

| | | |
|---|---|---|
| 4,970,686 A | 11/1990 | Naruke et al. |
| 6,266,269 B1 | 7/2001 | Karp et al. |
| 6,272,041 B1 | 8/2001 | Naji |
| 6,314,030 B1 | 11/2001 | Keeth |
| 6,731,535 B1 | 5/2004 | Ooishi et al. |
| 6,778,432 B2 | 8/2004 | Ohtani |
| 6,885,578 B2 | 4/2005 | Cha |
| 6,917,540 B2 | 7/2005 | Ooishi |
| 7,102,910 B2 | 9/2006 | Pham et al. |
| 7,206,220 B2 | 4/2007 | Ditewig et al. |
| 7,245,546 B2 | 7/2007 | Uvieghara |
| 7,254,078 B1 | 8/2007 | Park et al. |
| 7,286,437 B2 | 10/2007 | Kim et al. |
| 7,492,629 B2 | 2/2009 | Sugibayashi et al. |
| 7,630,226 B2 | 12/2009 | Matsufuji et al. |
| 7,656,738 B2 | 2/2010 | Namekawa |
| 7,688,613 B2 | 3/2010 | Chung et al. |

(Continued)

OTHER PUBLICATIONS

International Preliminary Report on Patentability—PCT/US2011/042092, The International Bureau of WIPO—Geneva, Switzerland, Oct. 15, 2012.

(Continued)

*Primary Examiner* — Trong Phan
(74) *Attorney, Agent, or Firm* — Sam Talpalatsky; Nicholas J. Pauley; Joseph Agusta

(57) ABSTRACT

Read and write operations of a non-volatile memory (NVM) bitcell have different optimum parameters resulting in a conflict during design of the NVM bitcell. A single bitline in the NVM bitcell prevents optimum read performance. Read performance may be improved by splitting the read path and the write path in a NVM bitcell between two bitlines. A read bitline of the NVM bitcell has a low capacitance for improved read operation speed and decreased power consumption. A write bitline of the NVM bitcell has a low resistance to handle large currents present during write operations. A memory element of the NVM bitcell may be a fuse, anti-fuse, eFUSE, or magnetic tunnel junction. Read performance may be further enhanced with differential sensing read operations.

23 Claims, 7 Drawing Sheets

(56) References Cited

U.S. PATENT DOCUMENTS

| | | |
|---|---|---|
| 7,710,813 B1 | 5/2010 | Im et al. |
| 7,724,600 B1 | 5/2010 | Im et al. |
| 7,817,455 B2 | 10/2010 | Fredeman et al. |
| 7,911,820 B2 | 3/2011 | Anand et al. |
| 8,116,152 B2 | 2/2012 | Kaku et al. |
| 8,134,854 B2 | 3/2012 | Huang |
| 8,331,126 B2 | 12/2012 | Terzioglu |
| 2008/0002504 A1 | 1/2008 | Nakano et al. |
| 2008/0094898 A1 | 4/2008 | Nakano et al. |
| 2008/0165564 A1 | 7/2008 | Namekawa |
| 2010/0032778 A1 | 2/2010 | Lu et al. |

OTHER PUBLICATIONS

International Search Report and Written Opinion—PCT/US2011/042092, ISA/EPO—Sep. 6, 2011.

NON-VOLATILE MEMORY WITH SPLIT WRITE AND READ BITLINES

CROSS REFERENCE TO RELATED APPLICATION

This application is a continuation of U.S. Patent Application Ser. No. 12/849,862 entitled "Non-Volatile Memory with Split Write and Read Bitlines" filed Aug. 4, 2010, now U.S. Pat. No. 8,331,126, which claims the benefit of U.S. Provisional Patent Application No. 61/359,155 entitled "Non-Volatile Memory with Split Write and Read Bitlines" filed Jun. 28, 2010.

TECHNICAL FIELD

The present disclosure generally relates to non-volatile memory (NVM). More specifically, the present disclosure relates to enhancing performance of non-volatile memory bitcells by splitting bitlines.

BACKGROUND

Non-volatile memory (NVM) bitcells, such as eFUSE bitcells, have a single bitline for reading and writing operations to the bitcell and a single access transistor for read and write operations. However, read and write operations have different operational characteristics, which results in conflicts when designing the NVM bitcell. A conventional NVM bitcell will be described with reference to FIG. 1 below.

FIG. 1 is a circuit schematic illustrating a conventional non-volatile memory bitcell. An NVM bitcell 100 includes a fuse element 102 and an access transistor 104. The fuse element 102 is coupled to a bitline 112 and the access transistor 104. A gate of the access transistor 104 is coupled to a wordline 114.

Write operations in NVM bitcells involve large currents best handled by low resistance bitlines. Additionally, the access transistor for a write operation occupies a large die area to handle the large currents. Low resistance, large bitlines have a large capacitance. For example, some conventional bitlines have capacitances of several picoFarads.

Read operations in NVM bitcells involve small sensing currents best handled by low capacitance bitlines. Thus, a design conflict arises when designing an NVM bitcell for read and write operations. The large capacitance of the bitlines for write operations results in low read speeds and high average and surge read currents. As a result of the NVM bitcell sharing a single bitline for read and write operations, the NVM bitcell is unable to be designed for both high and low voltage operation. Additionally, operating multiple voltages (write voltage and read voltage) on a single bitline of the NVM bitcell increases complexity of peripheral circuitry coupled to the NVM bitcell.

Alternative designs for NVM bitcells include a differential arrangement. FIG. 2 is a circuit schematic illustrating a conventional non-volatile memory bitcell with differential sensing. An NVM bitcell 200 includes a fuse element 202 coupled to an odd bitline 206 and a fuse element 222 coupled to an even bitline 226. An access transistor 204 is coupled to the fuse element 202 and is controlled by an odd wordline 214. An access transistor 224 is coupled to the fuse element 222 and is controlled by an even wordline 234. Although the differential design can increase read performance, adding a second bitline increases the resistance of the bitlines because conducting line layers (e.g., metal layers) available on the die are shared by the odd bitline 206 and the even bitline 226. When fewer conducting line layers are assigned to a bitline, the resistance of the bitline increases.

Thus, there is a need for amore reliable and higher performance non-volatile memo bitcell.

BRIEF SUMMARY

According to one a embodiment, a non-volatile memory (NVM) bitcell includes a first NVM one-time-write element coupled to a write bitline. The bitcell also includes a first write access transistor coupling the first NVM one-time-write element to a ground. A gate of the first write access transistor is coupled to a write word/inc. The bit cell also includes a first read access transistor coupling the first NVM one-time-write element to a read bitline. A gate of the first read access transistor is coupled to a read wordline.

According to another embodiment, a method of reading from a non-volatile memory (NVM) one-time-write element includes biasing a write bitline coupled to the NVM one-time-write element to zero. The method also includes applying a high signal to a read wordline to switch on a read access transistor coupling the NVM one-time-write element to a read bitline. The method further includes sensing a current through the NVM one-time-write element to determine a state of the NVM one-time-write element.

According to a further embodiment, a method of writing to a non-volatile memory (NVM) one-time-write element includes applying a write voltage to a write bitline coupled to the NVM one-time-write element. The method also includes applying a high signal to a write wordline to switch on a write access transistor causing current to flow through the NVM one-time-write element.

According to yet another embodiment, an apparatus includes a non-volatile memory (NVM) one-time-write element. The apparatus also includes means for writing to the NVM one-time-write element coupled to the NVM one-time-write element. The apparatus further includes a write transistor coupling a NVM one-time-write element to a ground. A gate of the write transistor is coupled to a write wordline. The apparatus also includes means for reading from the NVM one-time-write element. The apparatus further includes a read transistor coupling the NVM one-time-write element to the reading means. A gate of the read transistor is coupled to a read wordline.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Non-volatile memory (NVM) bitcells with separate physical bitlines for read and write operations offer improved read and write performance compared with single bitline NVM bitcells. Each of the bitlines in the NVM bitcell are designed for read or write operations. Thus, low bitline capacitance is provided during read operations and low resistance is provided during write operations.

Figure 1:
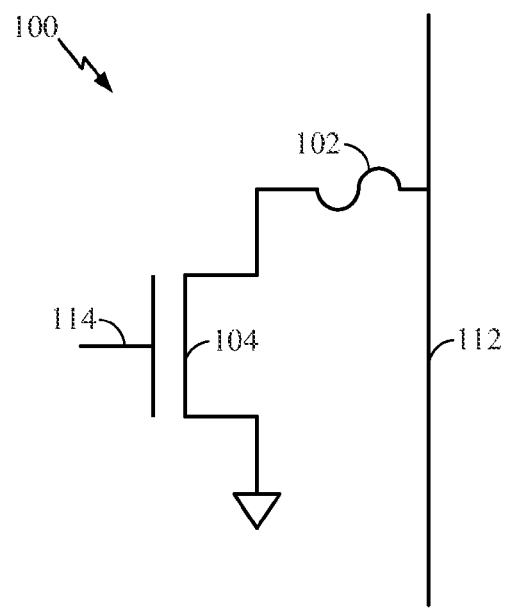
FIG. 1 is a circuit schematic illustrating a conventional non-volatile memory bitcell.
Figure 2:
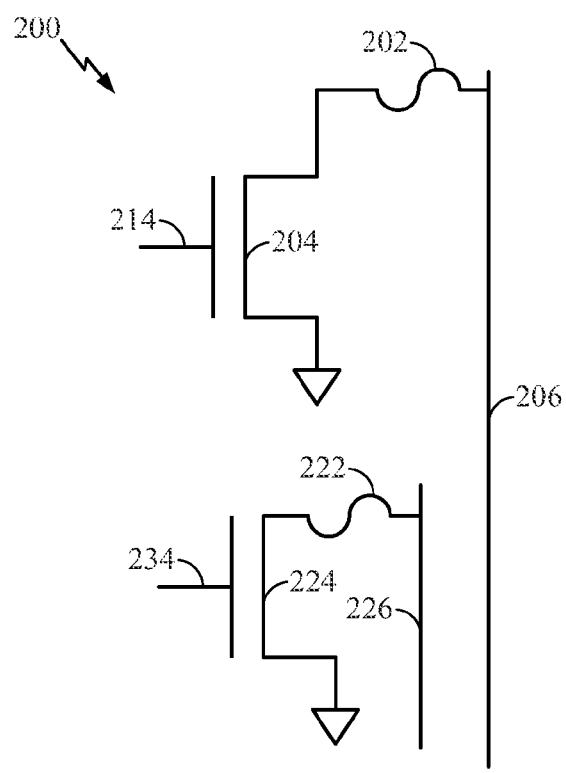
FIG. 2 is a circuit schematic illustrating a conventional non-volatile memory bitcell with differential sensing.
Figure 3:
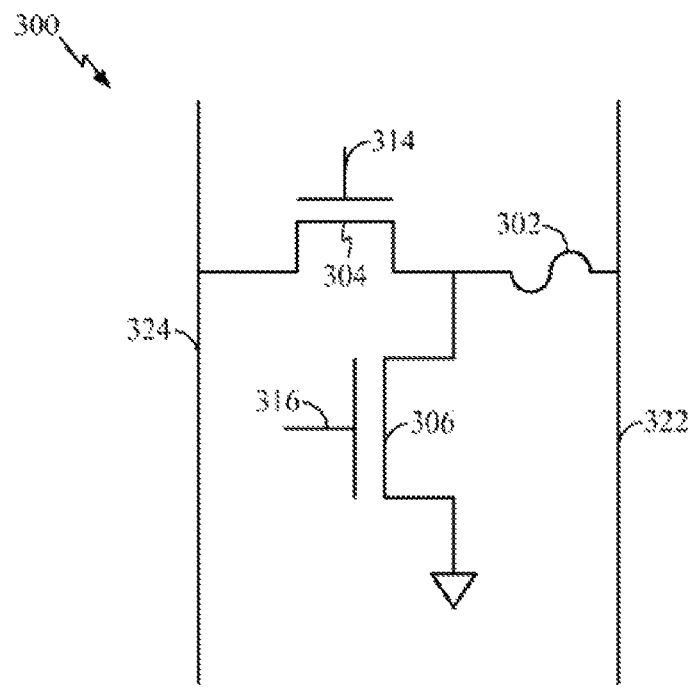
FIG. 3 is a circuit schematic illustrating an exemplary non-volatile memory bitcell according to one embodiment.

FIG. 3 is a circuit schematic illustrating an exemplary non-volatile memory bitcell according to one embodiment. A NVM bitcell 300 includes a memory element 302 coupled to a write bitline 322. The memory element 302 may be, for example, a fuse, an anti-fuse, an eFUSE, or a magnetic tunnel junction (MTJ). According to one embodiment, the memory element 302 is a one-time-write device, which is written at most once per bitcell. A write access transistor 306 is coupled to the memory element 302 and a ground. A gate of the write access transistor 306 is coupled to a write wordline 316. A read access transistor 304 is coupled to the memory element 302 and to a read bitline 324. A gate of the read access transistor 304 is coupled to a read wordline 314.

According to one embodiment, the read bitline 324 is a low capacitance bitline designed for high performance read operations. According to one embodiment, the write bitline 322 is a low resistance bitline designed for high current write operations. The resistance of the write bitline 322 may be reduced by adding metal layers to the write bitline 322.

A write operation may be performed on the memory element 302 by isolating the read bitline 324 and placing a low signal on the read wordline 311. A write voltage is applied to the write bitline 322 and a high signal applied to the write wordline 316. According to one embodiment, the write voltage is 1.8 Volts and the high signal is 1.0 Volts. The write access transistor 306 switches on to allow current to flow through the memory element 302 from the write bitline 322 to the ground coupled to the write access transistor 306. According to one embodiment, the memory element 302 is a fuse element and the current through the memory element 302 breaks the fuse resulting in an open circuit at the memory element 302 during read operations.

A read operation may be performed on the memory element 302 by placing a low signal on the write wordline 316. The write bitline 322 is biased to zero by a column keeper (not shown) and a high signal is applied to the read wordline 314. According to one embodiment, the high signal is 1.0 Volts. The read access transistor 304 switches on to conduct current through the memory element 302 from the write bitline 322 to the read bitline 324. An amount of current through the memory element 302 may be measured to determine the state of the memory element 302. For example, if the memory element 302 is a fuse and no current passes through the memory element 302, the memory element may be a "0." Alternatively, if the memory element 302 is a fuse and current passes through the memory element 302, the memory element may be a "1." According to one embodiment, the current through the memory element 302 is sensed by applying a voltage to the read bitline 324. If the voltage of the read bitline 324 significantly rises, the memory element 302 is an open circuit, if the voltage of the read bitline 324 does not significantly rise, the memory element 302 is a short circuit.

The exemplary NVM bitcell design of FIG. 3 improves read performance by placing a low capacitance read bitline 324 in the NVM bitcell 300. The additional read bitline 324 and the read access transistor 304 occupy additional die area, however, the die area occupied by the read access transistor 304 is significantly smaller than the die area occupied by the write access transistor 306. Thus, the overall die area occupied by the exemplary NVM bitcell design 300 of FIG. 3 is not significantly increased.

Figure 4:
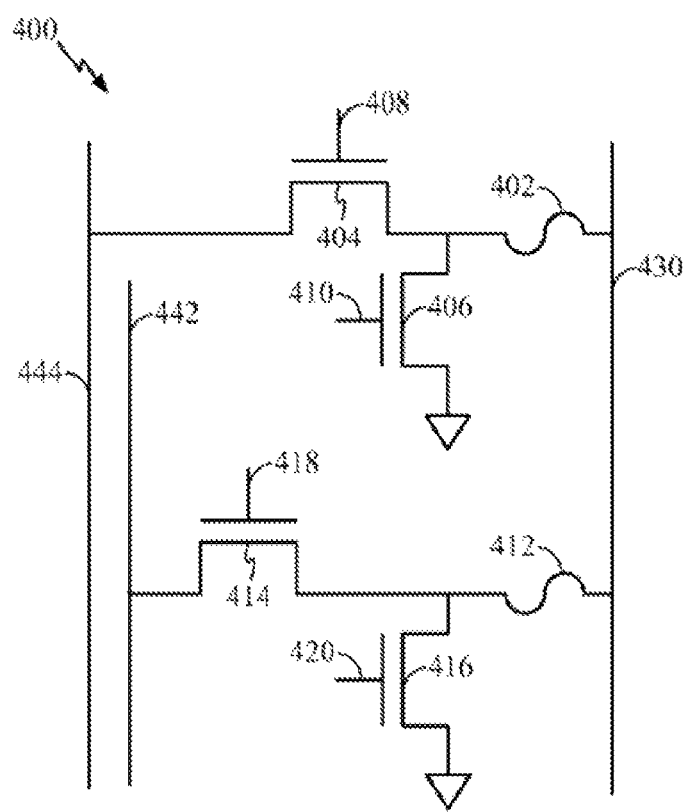
FIG. 4 is a circuit schematic illustrating an exemplary non-volatile memory bitcell with differential sensing according to one embodiment.

According to another embodiment, a read bitline is added to a differential NVM bitcell design. FIG. 4 is a circuit schematic illustrating an exemplary non-volatile memory bitcell with differential sensing according to one embodiment. A differential NVM bitcell 400 includes a write bitline 430. The write bitline 430 is coupled to and shared by memory elements 402, 412. The memory element 402 is coupled to a read access transistor 404 and a write access transistor 406. The write access transistor 406 couples the memory element 402 to a ground and is controlled by an even write wordline 410. The read access transistor 404 couples the memory element 402 to an even read bitline 444 and is controlled by an even read wordline 408.

The memory element 412 is coupled to a write access transistor 416 and a read access transistor 414. The write access transistor 416 couples the memory element 412 to a ground and is controlled by an odd write wordline 420. The read access transistor 414 couples the memory element 412 to an odd read bitline 442 and is controlled by an odd read wordline 418.

During a read operation in the differential NVM bitcell, a sensed current through the memory element 412 may be compared with a sensed current through the memory element 402. For example, an operational amplifier 440 may compare the voltage present on the even read bitline 444 and the odd read bitline 442. The differential NVM bitcell 400 includes the single write bitline 430, which has a low resistance. The resistance of the single write bitline 430 is minimized or decreased by reducing resources (e.g., metal lines) shared between the write bitline 430 and other write bitlines (not shown). The read bitlines 442, 444 are designed to have a low capacitance to improve read operations without affecting the ability of the NVM 400 to handle large current write operations.

Figure 5:
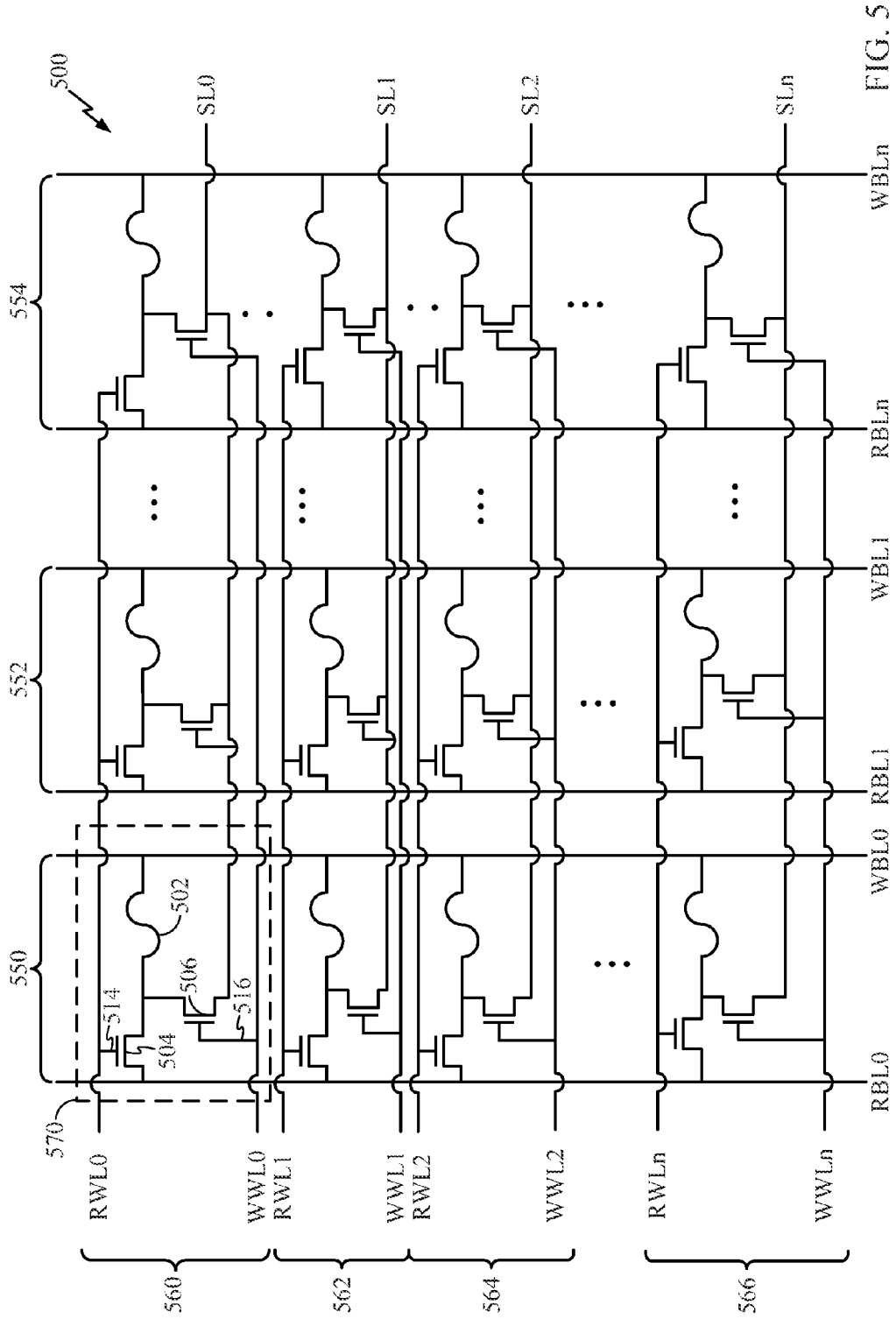
FIG. 5 is a circuit schematic illustrating an exemplary array of non-volatile memory bitcells according to one embodiment.

FIG. 5 is a circuit schematic illustrating an exemplary array of non-volatile memory bitcells according to one embodiment. An array 500 includes a number of bitcells 570. Each bitcells, such as the bitcell 570, includes a memory element 502 coupled to a read access transistor 504 and a write access transistor 506. The memory element 502 of the bitcell 570 is coupled to a write bitline, WBL0. A gate 516 of the write access transistor 506 is coupled to a write wordline, WWL0, and a gate 514 of the read access transistor 504 is coupled to a read wordline, RWL0. The read access transistor 504 couples the memory element 502 to a read bitline, RBL0. The write access transistor 506 couples the memory element 502 to a source line, SL0, which may be, for example, coupled to ground.

The bitcell 570 is repeated along columns 550, 552, 554 corresponding to bitlines RBL0 and WBL0, RBL1 and WBL1, and RBLn and WBLn. Although only three columns are shown in the array 500, additional columns may be present. The bitcell 570 is also repeated along rows 560, 562, 564, 566 corresponding to wordlines RWL0 and WWL0, RWL1 and WWL1, RWL2 and WWL2, and RWLn and WWLn. Although only four rows are shown in the array 500, additional rows may be present.

The bitcell 570 is repeated along columns 550, 552, 554 corresponding to bitlines RBL0 and WBL0, RBL1 and WBL1, and RBLn and WBLn. Although only three columns are shown in the array 500, additional columns may be present. The bitcell 570 is also repeated along rows 560, 562, 564, 566 corresponding to source lines and wordlines. For example, row 560 includes source line SL0 and wordlines RWL0 and WWL0; row 562 includes source line SL1 and wordlines RWL1 and WWL1; row 564 includes source line SL2 and wordlines RWL2 and WWL2; and row 566 includes source line SLn and wordlines RWLn and WWLn. Although only four rows are shown in the array 500, additional rows may be present.

Figure 6:
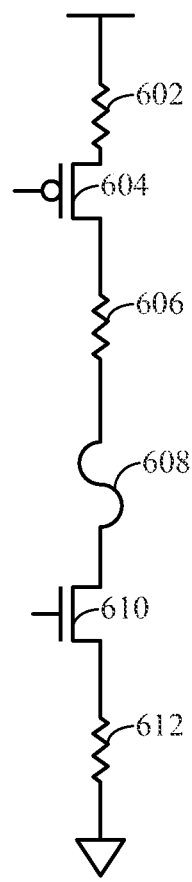
FIG. 6 is a circuit schematic illustrating an equivalent circuit to an exemplary non-volatile memory bitcell according to one embodiment.

Performance of NVM bitcells may be further improved by minimizing or reducing the resistance by selecting a non-square bitcell geometry, FIG. 6 is a circuit schematic illustrating an equivalent circuit to an exemplary NVM bitcell according to one embodiment. A resistance 602 represents a chip-level parasitic resistance, a resistance 606 represents a bitline resistance, and a resistance 612 represents a source parasitic resistance. A transistor 604 represents a column select transistor, and a transistor 610 represents a program transistor. A memory element 608 is coupled between the bitline resistance 606 and the program transistor 610.

When selecting a bitcell geometry a tradeoff occurs between height of the bitcell and width of the bitcell. A taller bitcell results in a lower program transistor resistance 610 but a higher bitline resistance 606. A shorter bitcell results in a higher program transistor resistance 610 but lower bitline resistance 606. For a given bitcell width, an effective resistance of the bitline resistance 606 and the program transistor resistance 610 is given by $$R_{eff} = n * R_m * y + R_{ds}/(f*y),$$

where n is the number of rows per bitline, $R_m$, is the bitline resistance per unit height, $y$ is the bitcell height, $R_{ds}$, is the program transistor linear resistance, and f is the number of layout fingers inside the bitcell layout.

Figure 7:
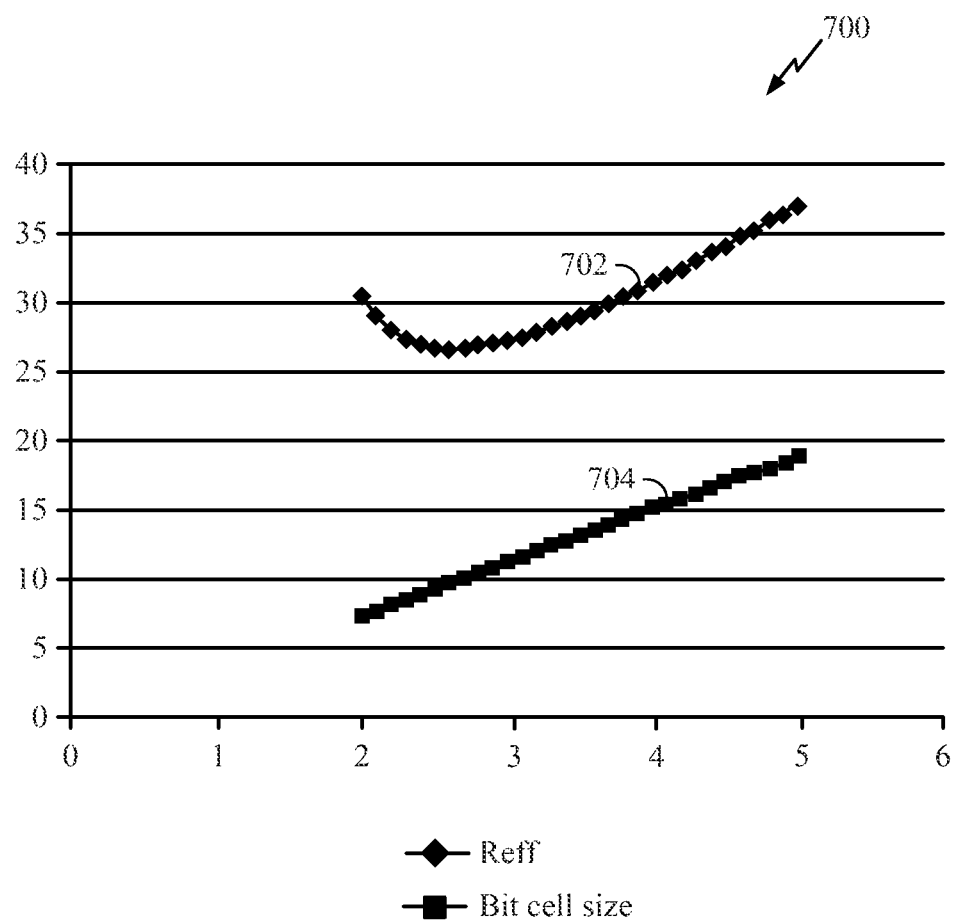
FIG. 7 is a graph illustrating a resistance of a bitcell as a function of bitcell height according to one embodiment.

FIG. 7 is a graph illustrating a resistance of a bitcell as a function of bitcell height according to one embodiment. A graph 700 illustrates on a line 702 an effective resistance as a function of bitcell height. The graph 700 also illustrates on a line 704 a bit cell size as a function of bitcell height. The graph 700 demonstrates that a minimum resistance is not always achieved at a minimum cell height.

Figure 8:
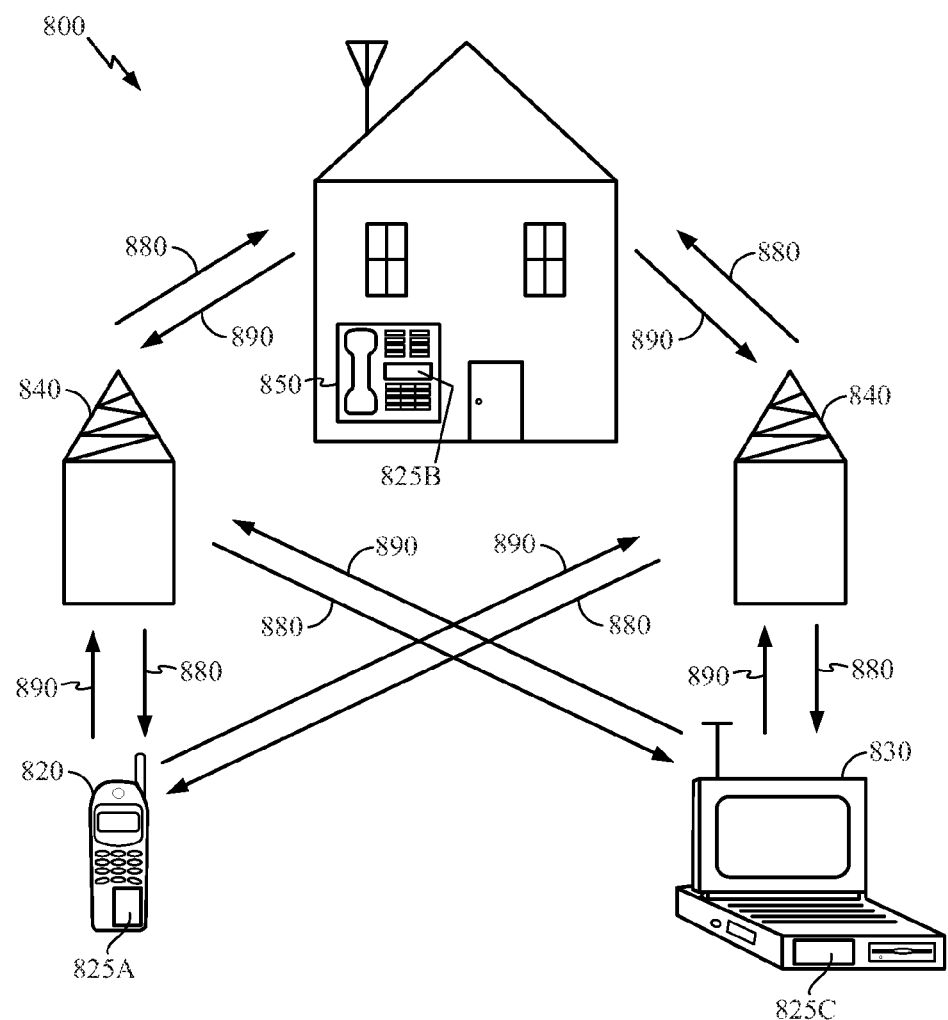
FIG. 8 is a block diagram showing an exemplary wireless communication system in which an embodiment of the disclosure may be advantageously employed.

FIG. 8 is a block diagram showing an exemplary wireless communication system 800 in which an embodiment of the disclosure may be advantageously employed. For purposes of illustration. FIG. 8 shows three remote units 820, 830, and 850 and two base stations 840. It will be recognized that wireless communication systems may have many more remote units and base stations. Remote units 820, 830, and 850 include IC devices 825A, 825C and 82513, that include the disclosed non-volatile memory. It will be recognized that any device containing an IC may also include the non-volatile memory bitcell disclosed here, including the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be mobile phones, hand-held, personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 8 illustrates remote units according to the teachings of the disclosure, the disclosure is not limited, to these exemplary illustrated units. Embodiments of the disclosure may be suitably employed in any device which includes a memory device.

Figure 9:
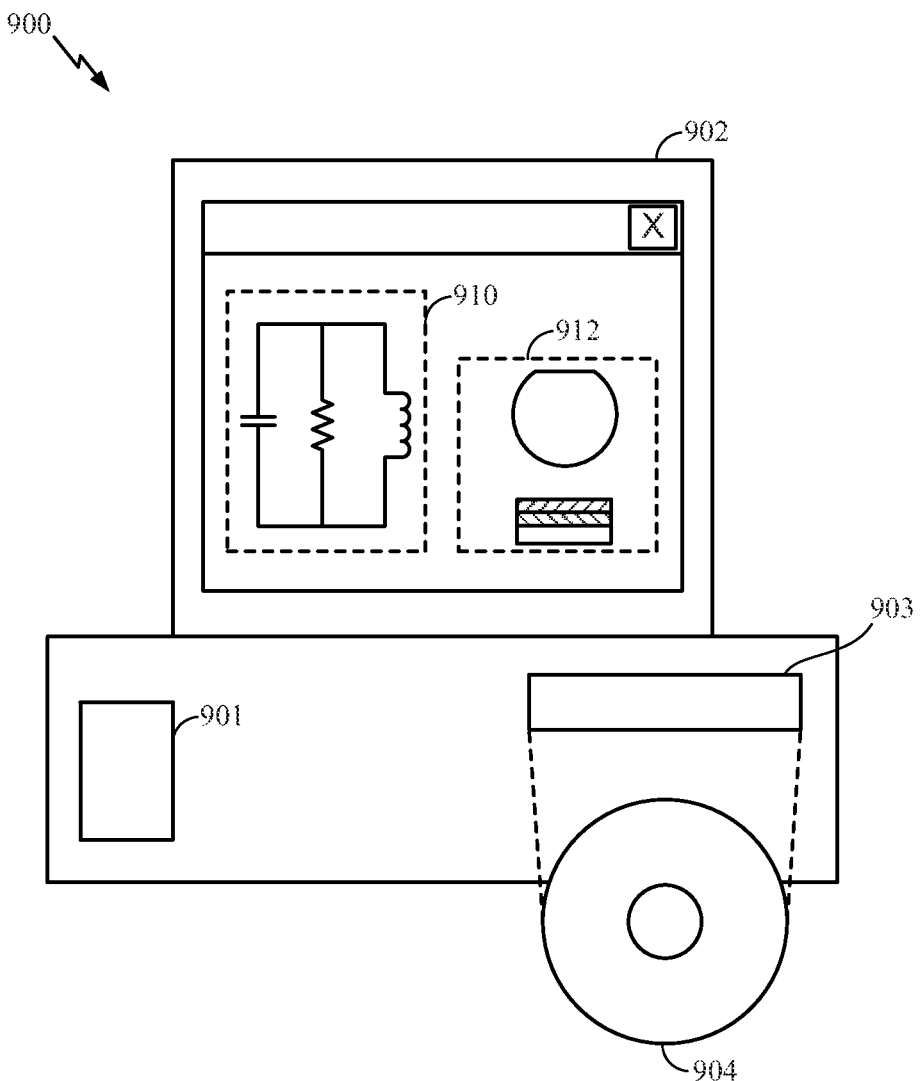
FIG. 9 is a block diagram illustrating a design workstation used for circuit, layout, and logic design of a semiconductor component according to one embodiment.

FIG. 9 is a block diagram illustrating a design workstation used for circuit, layout, and logic design of a semiconductor component, such as a non-volatile memory bitcell as disclosed above. A design workstation 900 includes a hard disk 901 containing operating system software, support files, and design software such as Cadence or OrCAD. The design workstation 900 also includes a display to facilitate design of a circuit 910 or a semiconductor component 912 such as non-volatile memory. A storage medium 904 is provided for tangibly storing the circuit design 910 or the semiconductor component 912. The circuit design 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the semiconductor component 912 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present invention.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A non-volatile memory (NVM) bitcell, comprising:
    a first NVM one-time-write element coupled to a write bitline;
    a first write access transistor coupling the first NVM one-time-write element to a source line, a gate of the first write access transistor coupled to a write wordline; and
    a first read access transistor coupling the first NVM one-time-write element to a read bitline, a gate of the first read access transistor coupled to a read wordline, the first read access transistor occupying an area of different size of the NVM bitcell than the first write access transistor.

2. The bitcell of claim 1, in which the first read access transistor occupies a smaller area than the first write access transistor.

3. The bitcell of claim 1, in which the first NVM one-time-write element is a fuse, an anti-fuse, and/or a magnetic tunnel junction (MTJ).

4. The bitcell of claim 1, further comprising:
    a second NVM one-time-write element coupled to the write bitline;
    a second write access transistor coupling the second NVM one-time-write element to the source line, a gate of the second write access transistor coupled to an odd write wordline; and
    a second read access transistor coupling the second NVM one-time-write element to an odd read bitline, a gate of the second read access transistor coupled to an odd read wordline,
    in which the first NVM one-time-write element is coupled to an even read bitline and the gate of the first read access transistor is coupled to an even read wordline.

5. The bitcell of claim 1, in which the read bitline comprises a low capacitance line and the write bitline comprise a low resistance line.

6. The bitcell of claim 1, in which the bitcell occupies a non-square die area.

7. The bitcell of claim 1, in which the bitcell is integrated into a memory array.

8. The bitcell of claim 7, in which the memory array is integrated into a mobile phone, a set top box, a music player, a video player, an entertainment unit, a navigation device, a computer, a hand-held personal communication systems (PCS) unit, a portable data unit, and/or a fixed location data unit.

9. A method of reading from a non-volatile memory (NVM) one-time-write element, the method comprising:
    applying a high signal to a read wordline to switch on a read access transistor coupling the NVM one-time-write element to a read bitline;
    applying a current from the write bitline to the read bitline, via the read access transistor and through the NVM one-time-write element; and
    sensing the current through the NVM one-time-write element to determine a state of the NVM one-time-write element.

10. The method of claim 9, further comprising placing a low signal on a write wordline of a write access transistor coupled to the NVM one-time-write element, the read access transistor occupying an area of different size of the NVM one-time-write element than the write access transistor.

11. The method of claim 10, further comprising placing a low signal on a write wordline of a write access transistor coupled to the NVM one-time-write element, the read access transistor occupying a smaller area than the write access transistor.

12. The method of claim 9, further comprising comparing the sensed current through the NVM one-time-write element to a second sensed current through a different NVM one-time-write element.

13. The method of claim 9, further comprising integrating the NVM one-time-write element into a mobile phone, a set top box, a music player, a video player, an entertainment unit, a navigation device, a computer, a hand-held personal communication systems (PCS) unit, a portable data unit, and/or a fixed location data unit.

14. A method of writing to a non-volatile memory (NVM) one-time-write element, the method comprising:
- isolating a read bitline from a NVM one-time-write element coupled to a read access transistor;
- applying a write voltage to a write bitline coupled to the NVM one-time-write element; and
- applying a high signal to a write wordline to switch on a write access transistor causing current to flow through the NVM one-time-write element from the write bitline to a source line coupled to the write access transistor, the read access transistor occupying an area of different size of the NVM one-time-write element than the first write access transistor.

15. The method of claim 14, in which the read access transistor occupies a smaller area than the write access transistor.

16. The method of claim 14, in which isolating the read bitline comprises applying a low signal to a read wordline to switch off the read access transistor.

17. The method of claim 14, further comprising integrating the NVM one-time-write element into a mobile phone, a set top box, a music player, a video player, an entertainment unit, a navigation device, a computer, a hand-held personal communication systems (PCS) unit, a portable data unit, and/or a fixed location data unit.

18. An apparatus, comprising:
- a non-volatile memory (NVM) one-time-write element;
- means for writing to the NVM one-time-write element coupled to the NVM one-time-write element;
- a write transistor coupling the NVM one-time-write element to a source line, a gate of the write transistor coupled to a write wordline,
- means for reading from the NVM one-time-write element; and
- a read transistor occupying an area of different size than the write transistor, the read transistor coupling the NVM one-time-write element to the reading means, a gate of the read transistor coupled to a read wordline.

19. The apparatus of claim 18, in which the read transistor occupies a smaller area than the write transistor.

20. The apparatus of claim 18, in which the NVM one-time-write element is a fuse, an anti-fuse, an eFUSE, and/or a magnetic tunnel junction (MTJ).

21. The apparatus of claim 18, in which the reading means has a low capacitance and the writing means has a low resistance.

22. The apparatus of claim 18, in which the NVM one-time-write element is integrated into a memory array.

23. The apparatus of claim 22, in which the memory array is integrated into a mobile phone, a set top box, a music player, a video player, an entertainment unit, a navigation device, a computer, a hand-held personal communication systems (PCS) unit, a portable data unit, and/or a fixed location data unit.

* * * * *